(12) United States Patent
Hu et al.

(10) Patent No.: US 7,986,140 B2
(45) Date of Patent: Jul. 26, 2011

(54) SYSTEMS AND METHODS FOR RF MAGNETIC-FIELD VECTOR DETECTION BASED ON SPIN RECTIFICATION EFFECTS

(75) Inventors: Can-Ming Hu, Winnipeg (CA); Nikolai Mecking, Achterwehr (DE); Yongsheng Gui, Winnipeg (CA); Andre Wirthmann, Winnipeg (CA); Lihui Bai, Miyagi (JP)

(73) Assignee: University of Manitoba, Winnipeg (CA)

( * ) Notice: Subject to any disclaimer, the term of this patent is extended or adjusted under 35 U.S.C. 154(b) by 447 days.

(21) Appl. No.: 12/267,386

(22) Filed: Nov. 7, 2008

(65) Prior Publication Data

US 2009/0128143 A1 May 21, 2009

Related U.S. Application Data

(60) Provisional application No. 60/986,743, filed on Nov. 9, 2007.

(51) Int. Cl.
*G01B 7/30* (2006.01)
*G01S 3/02* (2006.01)
(52) U.S. Cl. ............. 324/207.25; 324/260; 324/76.56
(58) Field of Classification Search .............. None
See application file for complete search history.

(56) References Cited

U.S. PATENT DOCUMENTS 7,203,618 B2 * 4/2007 Hammerschmidt et al. .. 702/151
7,408,344 B2 * 8/2008 Tokuhara ............... 324/252

OTHER PUBLICATIONS

Azevedo et al., "dc effect in ferromagnetic resonance: evidence of the spin-pumping effect?" *J. Appl. Phys.*, 97:10C715, 2005.
Bai et al., "The rf magnetic-field vector detector based on the spin rectification effect," *Applied Physics Letters*, 92:32504, 2008.
Berger, "Emission of spin waves by a magnetic multilayer traversed by a current," *Phys. Rev. B.*, 54:9353, 1996.
Berger, "Generation of dc voltages by a magnetic multilayer undergoing ferromagnetic resonance," *Phys. Rev. B.*, 59:11465, 1999.
Brataas et al., "Spin battery operated by ferromagnetic resonance," *Phys. Rev. B.*, 66:060404 (R), 2002.
Camley and Mills, "Theory of microwave propagation in dielectric/ magnetic film multilayer structures," *J. Appl. Phys.*, 82:3058, 1997.

(Continued)

*Primary Examiner* — Ha Tran T Nguyen
*Assistant Examiner* — Trung Q Nguyen
(74) *Attorney, Agent, or Firm* — Fulbright & Jaworski, L.L.P.

(57) ABSTRACT

Systems and methods for RF magnetic-field vector detection based on spin rectification effects are described. In one embodiment, a method comprises sweeping a quasi-static external applied magnetic field at a h-vector detector, measuring voltages across terminals of the h-vector detector when the detector receives a microwave, varying the angle between the external applied static magnetic field and the RF current, determining an angular dependence of the measured voltages, and calculating a magnetic-field vector (h-vector) component of the microwave. In another embodiment, a method comprises providing an array of h-vector detectors, each element of the array being positioned at a different angle with respect to each other, subjecting the array to an external swept quasi-static magnetic field, measuring voltages across terminals of each element of the array when the array receives a microwave, associating each measured voltage with a respective angle, and calculating at least one h-vector component of the microwave.

9 Claims, 6 Drawing Sheets

OTHER PUBLICATIONS

Costache et al., "Electrical detection of spin pumping due to the precessing magnetization of a single ferromagnet," *Phys. Rev. Lett.*, 97:216603, 2006.

Costache et al., "Large cone angle magnetization precession of an individual nanopatterned ferromagnet with dc electrical detection," *Appl. Phys. Lett.*, 89:232115, 2006.

Egan and Juretschke, "DC detection of ferromagnetic resonance in thin nickel films," *J. Appl. Phys.*, 34:1477, 1963.

Foner, "Hall effect in permalloys," *Phys. Rev.*, 99:1079,1955.

Ganichev et al., "Spin-galvanic effect," *Nature*, 417:153-6, 2002.

Gilbert, "A phenomenological theory of damping in ferromagnetic materials," *IEEE Trans. on Magn.*, 40:3443-9, 2004.

Goennenwein et al., "Electrically detected ferromagnetic resonance," *Appl. Phys. Lett.*, 90:162507, 2007.

Grollier et al., "Microwave spectroscopy on magnetization reversal dynamics of nanomagnets with electronic detection," *J. Appl. Phys.*, 100:024316, 2006.

Gui et al., "Electrical detection of the ferromagnetic resonance: spin-rectification versus bolometric effect," *Applied Physics Letters*, 91:082503, 2007.

Gui et al., "Quantized spin excitations in a ferromagnetic microstrip from microwave photovoltage measurements," *Phys. Rev. Lett.*, 98:217603, 2007.

Gui et al., "Realization of a room-temperature spin dynamo: the spin rectification effect," *Phys. Rev. Lett.*, 98:107602, 2007.

Gui et al., "Resonances in ferromagnetic gratings detected by microwave photoconductivity," *Phys. Rev. Lett.*, 95:056807, 2005.

Gurney et al., "Spin valve giant magnetoresistive sensor materials for hard disk drives," In: Ultrathin Magnetic Structures IV, Chapter 6, Springer, Berlin, Chapter 6, pp. 149-175, 2004.

Gurney et al., "Magnetic switching in high-density MRAM," In: Ultrathin Magnetic Structures IV, Chapter 7, Springer, Berlin, pp. 177-218, 2004.

Gurney et al., "Giant magneto-resistive random-access memories based on current-in-plane devices," In: Ultrathin Magnetic Structures IV, Chapter 8, Springer, Berlin, pp. 219-252, 2004.

Guru and Hiziroglu, "Waveguides and cavity resonators," In: Electromagnetic Field Theory Fundamentals, Chapter 10, Cambridge University Press, $2^{nd}$ Ed., pp. 502-546, 2004.

Hu and Ge, "The spin-driven electrical currents," *La Physique au Canada*, 63:75-78, 2007.

Hu, "Recent progress in spin dynamics research in Canada," *Physics in Canada*, 65:29, 2009.

Hui et al., "Electric detection of ferromagnetic resonance in single crystal iron film," *Appl. Phys. Lett.*, 93:232502, 2008.

Jan, In: *Solid State Physics*, Academic, New York, pp. 15-54, 1957.

Juretschke, "Electromagnetic theory of dc effects in ferromagnetic resonance," *J. Appl. Phys.*, 31:1401, 1960.

Kiselev et al., "Microwave oscillations of a nanomagnet driven by a spin-polarized current," *Nature*, 425:380-3, 2003.

Kittel, "On the theory of ferromagnetic resonance absorption," *Phys. Rev.*, 73:155, 1948.

Kupferschmidt et al., "Theory of the spin-torque-driven ferromagnetic resonance in a ferromagnet/normal-metal/ferromagnet structure," *Phys. Rev. B.*, 74:134416, 2006.

Landau and Liftshitz, "On the theory of the dispension of magnetic permeability in ferromagnetic bodies," *Physik. Z Sowjet.*, 8:153-169, 1935.

Lee and Rhie, "Spin pumping technique and its observation," *IEEE Trans. on Mag.*, 35:3784, 1999.

Mecking et al., "Microwave photovoltage and photoresitance effects in ferromagnetic microstrips," *Physical Review B*, 76:224430, 2007.

Moller and Juretschke, "Determination of spin-wave boundary conditions by dc effects in spin-wave resonance," *Phys. Rev. B.*, 2:2651, 1970.

Morrish, "Resonance in strongly coupled dipole systems," In: The Physical Principles of Magnetism, Chapter 10, IEEE Press Classic Reissue, New York, pp. 539-559 2001.

Mosendz et al., "Spin dynamics at low microwave frequencies in crystalline Fe ultrathin film double layers using co-planar transmission lines," *J. Magn. Magn. Mater.*, 300:174, 2006.

Oh et al., "Evidence of electron-spin wave coupling in $Co_xNb_y$ magnetic metal thin film," *J. Magn. Magn. Mater.*, 293:880, 2005.

Polder, "On the theory of ferromagnetic resonance, Chapter VIII," *Philosophical Magazine*, 40:99-115, 1949.

Puszkarski, "Theory of syrface states in spin wave resonance," *Prog. Surf Sci.*, 9:191-247, 1979.

Saitoh et al., "Conversion of spin current into charge current at room temperature: inverse spin-Hall effect," *Appl. Phys. Lett.*, 88:182509, 2006.

Sankey et al., "Spin-transfer-driven ferromagnetic resonance of individual nanomagnets," *Phys. Rev. Lett.*, 96:227601, 2006.

Slonczewski, "Current-driven excitation of magnetic multilayers," *J. Magn. Magn. Mater.*, 159:L1, 1996.

Sodha and Srivasta, *Microwave Propagation in Ferrimagnets*, Plenum Press, New York, 1981.

Tserkovnyak et al., "Nonlocal magnetization dynamics in ferromagnetic heterostructures," *Rev. Mod. Phys.*, 77:1375-1421, 2005.

Tulapurkar et al., "Spin-torque diode effect in magnetic tunnel junctions," *Nature*, 438:339-42, 2005.

Vonsovskii, *Ferromagnetic Resonances: the phenomenon of resonant absorption of a high-frequency magnetic field in ferromagnetic substances*, (Pergamon, New York) 38-39, 1966.

Wang et al., "Voltage generation by ferromagnetic resonance at a nonmagnet to ferromagnet contact," *Phys. Rev. Lett.*, 97:216602, 2006.

Wen, "Coplanar waveguide: a surface strip transmission line suitable for nonreciprocal gyromagnetic device application," *IEEE Trans. Microwave Theory Tech.*, 17:1087, 1969.

Wirthmann et al., "Broadband electrical detection of spin excitation in Ga0.98Mn0.02As using a photovoltage technique," *Applied Physics Letters*, 92:232106, 2008.

Yamaguchi et al., "Rectification of radio frequency current in ferromagnetic nanowire," *Appl. Phys. Lett.*, 90:182507, 2007.

Yamaguchi et al., "Self-homodyne rf demodulator using a ferromagnetic nanowire," *Appl. Phys. Lett.*, 90:212505, 2007.

Yang et al., "Spectral dependence of spin photocurrent and current-induced spin polorization in an InGaAs / InAlAs two-dimensional electron gas," *Phys. Rev. Lett.*, 96:186605, 2006.

Yau and Chang, "The planar Hall effect in thin foils of Ni-Fe alloy," *J. Phys. F.*, 1:38, 1971.

Zhu and Zheng, "The micromagnetics of magnetoresistive random access memory," In: Spin Dynamics in Confined Magnetic Structures I, Springer, Berlin, 289-323, 2002.

\* cited by examiner

SYSTEMS AND METHODS FOR RF MAGNETIC-FIELD VECTOR DETECTION BASED ON SPIN RECTIFICATION EFFECTS

CROSS-REFERENCE TO RELATED APPLICATIONS

This application claims priority to co-pending U.S. Provisional Application No. 60/986,743 filed Nov. 9, 2007, which is incorporated herein by reference in its entirety.

BACKGROUND OF THE INVENTION

1. Field of the Invention

The present invention relates generally to electromagnetism and, more particularly, to systems and methods for Radio-frequency (RF) magnetic-field vector (h-vector) detection based on spin rectification effects.

2. Description of Related Art

Microwave detection is essential in medical imaging, wireless communications, and many other applications. RF electric field (e) detectors have long been developed to utilize the impact of the e field on the charge properties of electronic devices. Meanwhile, conventional RF magnetic field (h) sensors detect the change of magnetic flux flowing through a loop based on Faraday's law.

BRIEF SUMMARY OF THE INVENTION

The present invention provides systems and methods for RF h-vector detection based on spin rectification effects. In one embodiment, a method comprises applying an external magnetic field H and sweeping it slightly at an h-vector detector, measuring voltages across terminals of the h-vector detector when the detector receives a microwave, varying the angle of the h-vector detector with respect to an external magnetic field H, determining an angular dependence of the measured voltages, and calculating at least one h-vector component of the microwave based, at least in part, upon the angular dependence. In another embodiment, another method comprises providing an array of h-vector detectors, each element of the array being positioned at a different angle with respect to each other, subjecting the array to an external static magnetic field, measuring voltages across terminals of each element of the array when the array receives a microwave, associating each measured voltage with a respective angle, and calculating at least one h-vector component of the microwave based, at least in part, upon the association.

The h-vector detector may comprise a ferromagnetic (e.g., metallic or semiconducting) microstrip having dimensions such that $d \ll w \ll l \ll \lambda$, where w is the width of the microstrip, d is the thickness of the microstrip, l is the length of the microstrip, and $\lambda$ is the wavelength of a microwave received by the microstrip. An h-vector detection system may comprise a plurality of microstrips, each of the plurality of microstrips having dimensions such that $d \ll w \ll l \ll \lambda$, where w is the width, d is the thickness, l is the length, and $\lambda$ is the wavelength of a received microwave, each of the microstrips being positioned at a different radial direction than the other microstrips to form a polar array. The h-vector detection system may further comprise one or more voltmeters coupled to terminals of each of the microstrips and a computer coupled to the one or more voltmeters.

The term "coupled" is defined as connected, although not necessarily directly, and not necessarily mechanically. The terms "a" and "an" are defined as one or more unless this disclosure explicitly requires otherwise. The terms "substantially," "approximately," "about," and variations thereof are defined as being largely but not necessarily wholly what is specified, as understood by a person of ordinary skill in the art. In one non-limiting embodiment, the term substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but it may also be configured in ways other than those specifically described herein.

BRIEF DESCRIPTION OF THE SEVERAL VIEWS OF THE DRAWINGS

For a more complete understanding of the present invention, reference is now made to the following drawings, in which.

DETAILED DESCRIPTION OF THE INVENTION

In the following detailed description, reference is made to the accompanying drawings that illustrate embodiments of the present invention. These embodiments are described in sufficient detail to enable a person of ordinary skill in the art to practice the invention without undue experimentation. It should be understood, however, that the embodiments and examples described herein are given by way of illustration only, and not by way of limitation. Various substitutions, modifications, additions, and rearrangements may be made without departing from the spirit of the present invention. Therefore, the description that follows is not to be taken in a limited sense, and the scope of the present invention is defined only by the appended claims.

The present invention provides systems and methods for RF h-vector detection based on spin rectification effects. Generally speaking, the spin rectification effect generates an electric signal due to ferromagnetic resonance (FMR) when driven by microwaves. This phenomenon is discussed at length.

Figure 1:
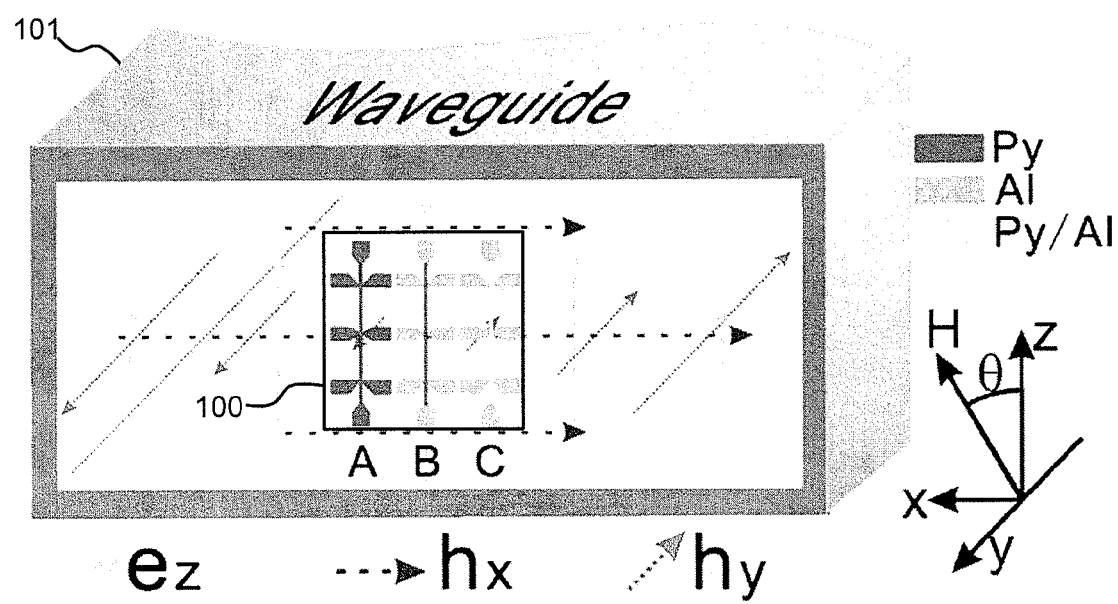
FIG. 1 is a diagram of an h-vector detector and a waveguide as an example of a radiation source according to one illustrative embodiment of the present invention.

In one embodiment of the present invention, a detector comprises one or more Permalloy (Py) microstrips. As shown in FIG. 1, when an external applied in-plane static magnetic field H with an angle θ with respect to the z-axis (axis of RF-current flow) is applied, the spin rectification effect induces a photovoltage (U) along the Py strip (parallel to the z-axis). This photovoltage may be expressed by:

$$U = -R_A R_{S0} M_0 \langle j_z m_{x\theta} \rangle \sin(2\theta) \qquad \text{Eq. (1)}$$

where $R_A = \Delta\rho/\rho M_0^2$ is the anisotropic magnetoresistance (AMR) coefficient, $\rho$ is the resistivity, $\Delta\rho$ is the change of resistivity, $M_0$ is the saturation magnetization, $R_{S0}$ is the resistance of the strip, $j_z$ is the RF current along the detector strip, $m_{x\theta}$ is the dynamic magnetization perpendicular to the external applied static magnetic field but within the film plane of the detector, and $\langle \rangle$ denotes a time average. As such, U is determined by the time average of $m_{x\theta}$ and $j_z$.

Thus, it follows from eq. (1) that at a fixed microwave frequency ω, the photovoltage U appears as a resonant signal of the FMR given by:

$$U = L \frac{\Delta H^2}{(H-H_0)^2 + \Delta H^2} + D \frac{\Delta H(H-H_0)}{(H-H_0)^2 + \Delta H^2} \qquad \text{Eq. (2)}$$

where H is the externally applied magnetic field, $H_0$ is the resonance field of the FMR and $\Delta H$ is the half width at half maximum (HWHM). In other words, U is a linear combination of a Lorentz and a dispersive line shape, with the respective amplitudes L and D determined by:

$$L = -R_A R_{S0} M_0 j_z \sin(2\theta)(-A_{xx} h_x^i \cos(\theta) + A_{xx} h_z^i \sin(\theta) - A_{xy} h_y^r)/2 \qquad \text{Eq. (3a)}$$

$$D = -R_A R_{S0} M_0 j_z \sin(2\theta)(A_{xx} h_x^r \cos(\theta) - A_{xx} h_z^r \sin(\theta) - A_{xy} h_y^i)/2 \qquad \text{Eq. (3b)}$$

where $h_{x,y,z}^{r,i}$ are h-vector components, the superscript of h indicating the real (r) and imaginary (i) parts of complex number of $h_{x,y,z}$, which represents the contributions with 0° and 90° oscillation phase shift with respect to $j_z$, and $A_{xx}$ and $A_{xy}$ are the amplitudes of the effective permeability tensor components linking the external RF magnetic field h with the internal magnetization m. They are given by:

$$A_{xx} = \frac{\gamma(H_0 M_0 + M_0^2)}{\alpha_G \omega(2H_0 + M_0)} \qquad \text{Eq. (4a)}$$

$$A_{xy} = \frac{M_0}{\alpha_G(2H_0 + M_0)} \qquad \text{Eq. (4b)}$$

for $|H-H_0| \ll H_0$, with γ being the gyromagnetic ratio and $\alpha_G$ being the Gilbert damping constant.

In certain embodiments, detectors with different contact configurations may be fabricated on the same chip of a semi-insulating substrate, for example, Silicon, GaAs and glass. Alternatively, contacts may be formed only at the extremities of the strip. Illustrative dimensions of a Py microstrip according to certain embodiments of the present invention may include a length (l) of approximately 3 mm, a width (w) of approximately 50 μm and a thickness (d) of approximately 45 nm. With dimensions such as these, the resulting microstrips have a sub-wavelength size where $d \ll w \ll l \ll \lambda$, where the microwave wavelength λ is about 2.5 cm (at 12 GHz).

One illustrative Py microstrip (sample A) may be entirely fabricated with Permalloy as material. Another microstrip (sample B) according to the present invention may be fabricated in two steps: a 60 nm-thick Al contact layer (forming only the contacts) may be first deposited followed by deposition of a Py strip. Yet another microstrip (sample C) may comprise a bi-layer of Py/Al, where the first layer has both a strip and the contacts comprising Al. From AMR and FMR measurements in Faraday configuration, the following values were obtained: $\mu_0 M_0 = 0.965$ T, $\gamma = 176$ $\mu_0$GHz/T, resistivity $\rho_0 = 4.6 \times 10^{-5}$ Ωcm, and $R_A = 0.0064$ $\mu_0^2/T^2$. The resistance of sample C was measured and is 79Ω, which is much smaller compared to that of sample A (642Ω) and B (748Ω) due to the high conductivity of the Al layer under the Py strip.

To demonstrate the ability of the systems and methods described herein to detect the microwave h vector, samples A-C were manufactured on single chip 100 and mounted at the end of rectangular waveguide 101, as shown in FIG. 1. Waveguide 101 may be, for example, a WR90 (8-12 GHz) or a WR62 (12-18 GHz) waveguide, which provides well-defined microwave propagation. Particularly, for a $TE_{10}$ mode propagating along the y direction, the e field is polarized along the z direction. Hence, the microwave current $j = \sigma e$ is induced along the z direction. Near the center of the end section of waveguide 101 (where chip 100 is mounted), the h field is approximately linearly polarized in the x direction, so that $h_x \gg h_y, h_z$.

Figure 2:
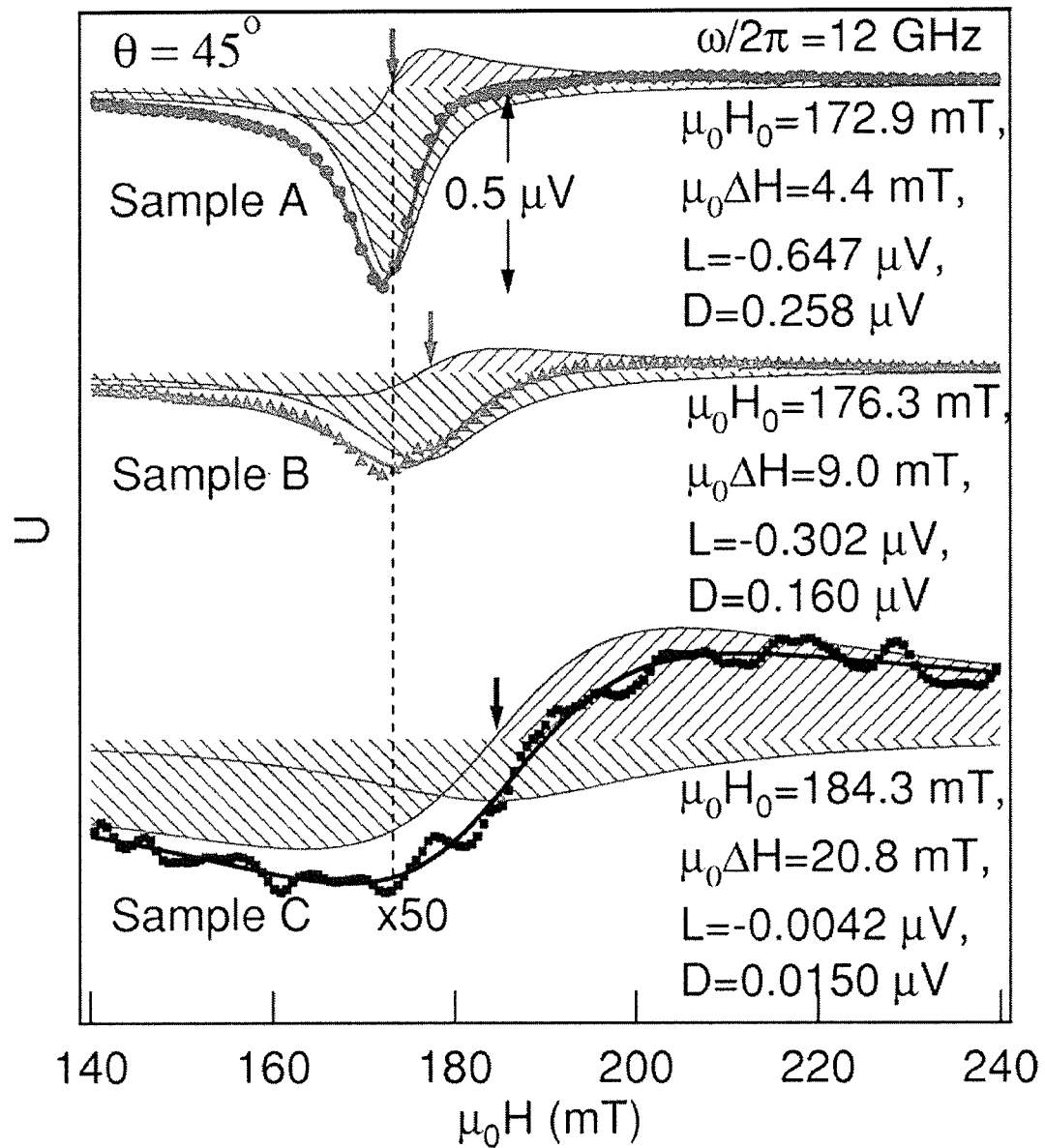
FIG. 2 is a graph of FMR data (symbols) fitted (lines) onto Eq. (2) and divided into symmetric (L) and asymmetric (D) portions according to one illustrative embodiment of the present invention.

FIG. 2 shows the photovoltage induced by the FMR and is measured as a function of external applied magnetic field H applied at θ=45°, where the photovoltage signal due to the spin-rectification effect reaches the maximum according to Eq. (1). The photovoltage signal was detected using conventional lock-in techniques to increase the sensitivity, by modulating the microwave output power. The photovoltage signals are comparable for sample A and B, but smaller for sample C due to its small resistance. The photocurrents in all three samples are of the same order within a few tenths of nA for a microwave output power of 25 dBm.

As shown in FIG. 2, the electrically detected FMR may be well fitted by Eq. (2), using L, D, $H_0$, and $\Delta H$ as fitting parameters. In contrast with conventional power detectors that typically display a Lorentz line shape at resonances, the asymmetric line shapes in FIG. 2 (characterized by the dispersive coefficients D) reflect the unique feature of the spin rectification effect, where the induced electrical signal is proportional to the amplitude of h instead of $|h|^2$. Therefore, the h-field vector may be determined by fitting the measured angular dependence of L and D to Eq. (3), using the components of h as the fitting parameters, as described below.

Figure 3:
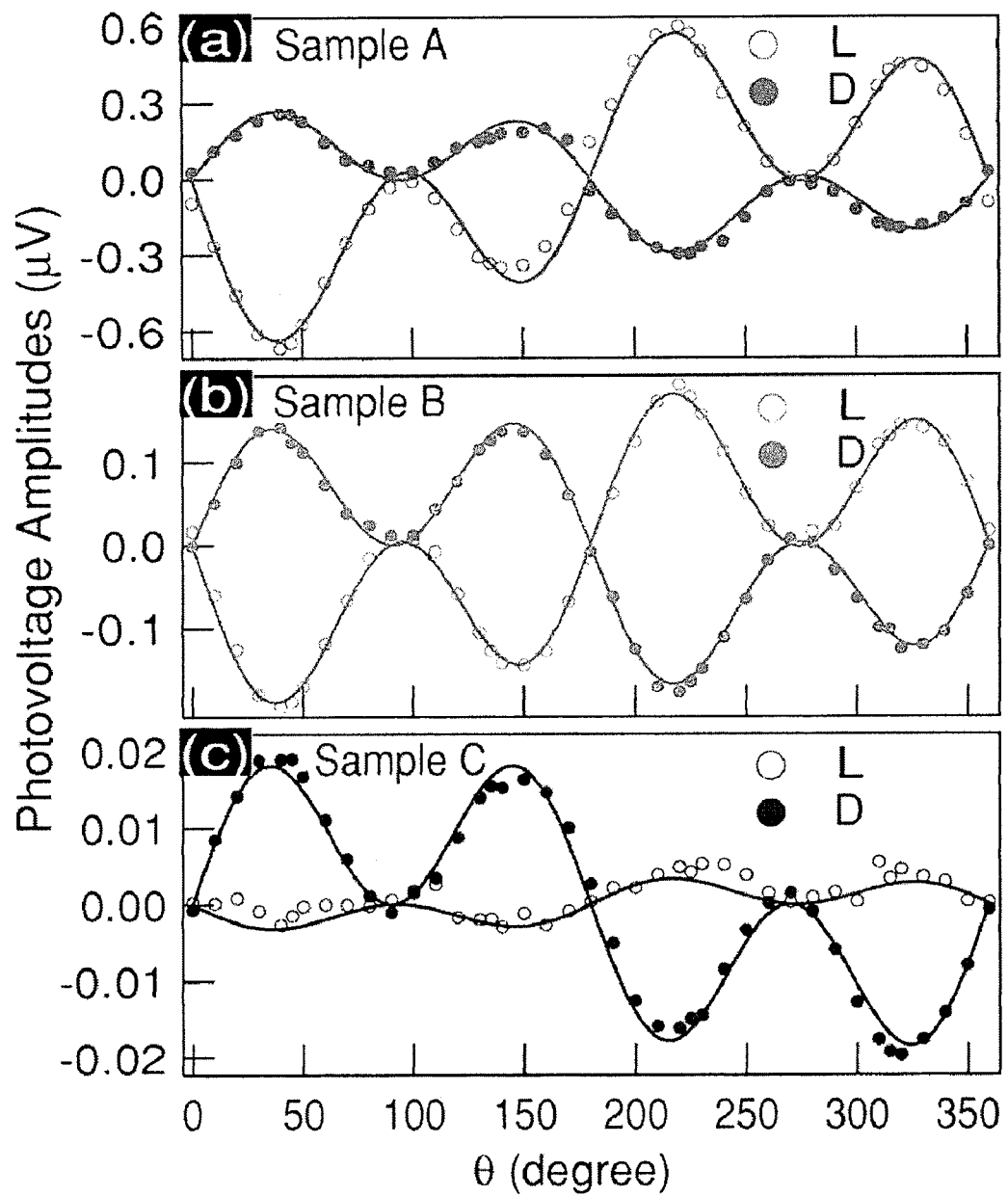
FIG. 3 is a graph of photovoltage amplitudes defined by Eq. (2) and plotted as a function of θ according to one illustrative embodiment of the present invention and fits according to Eqs. (3a) and (3b).

FIG. 3 summarizes the measured θ-dependence of L and D. Note that despite of the seemingly different line shapes shown in FIG. 2, two common features are observed regarding the θ-dependence. First, the photovoltage vanishes at high symmetry points (θ=0°, 90°, 180°, 270°), which confirms the overall sin(2θ) term in Eq. (3). Second, for this special mode ($TE_{10}$) both L and D curves are nearly antisymmetric with respect to θ=180°. Following Eq. (3), such a symmetry indicates that $h_x \gg h_y, h_z$, which is expected for the microwave polarization at the center end of waveguide 101 for the $TE_{10}$ mode. By fitting the data shown in FIG. 3 to Eq. (3), the h-vectors at all three detector positions are determined, and listed in Table I in their component forms below:

| | $|h_x|/|h_x|$ | $|h_y|/|h_x|$ | $|h_z|/|h_x|$ |
|---|---|---|---|
| Sample A | 1 | 0.042 | 0.217 |
| Sample B | 1 | 0.052 | 0.137 |
| Sample C | 1 | 0.007 | 0.019 |

In one embodiment, the operating frequency and sensitivity of certain h-vector detectors are determined by the resonant condition and the line width, respectively.

Figure 4:
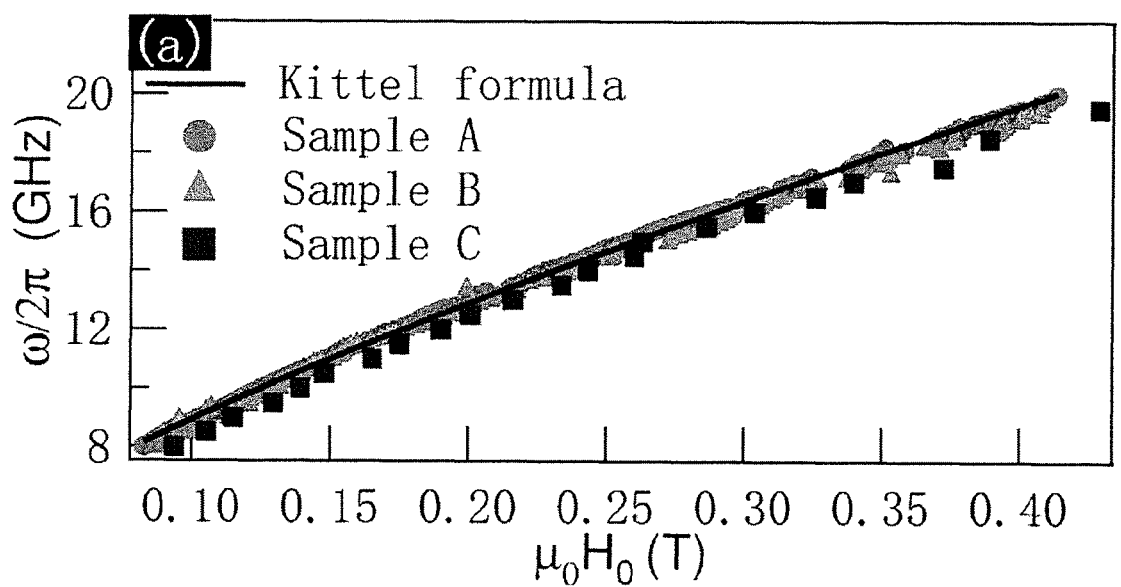
FIG. 4 is a graph of the dispersion of the FMR for θ=45°, where θ is the angle of the external applied static magnetic field with respect to the strip according to one illustrative embodiment of the present invention and fits according to the Kittel formula.

FIG. 4 shows the resonance frequency $\omega/2\pi$ ($H_0$) as a function of external applied static magnetic field measured at $\theta=45°$. The dispersion curves shown agree with the formula $\omega=\gamma\sqrt{H_0(H_0+M_0)}$ (line) described in C. Kittel, *On the Theory of Ferromagnetic Resonance Absorption*, Phys. Rev. 73, 155 (1948) for in plane configuration. These results demonstrate that the detectors described herein are capable of operating in a wide frequency range. In fact, in the experiment illustrated herein in the frequency range of 8-20 GHz is simply limited by the cutoff frequency of waveguide 101 (at the low end) and by the microwave generator (at the high end).

Figure 5:
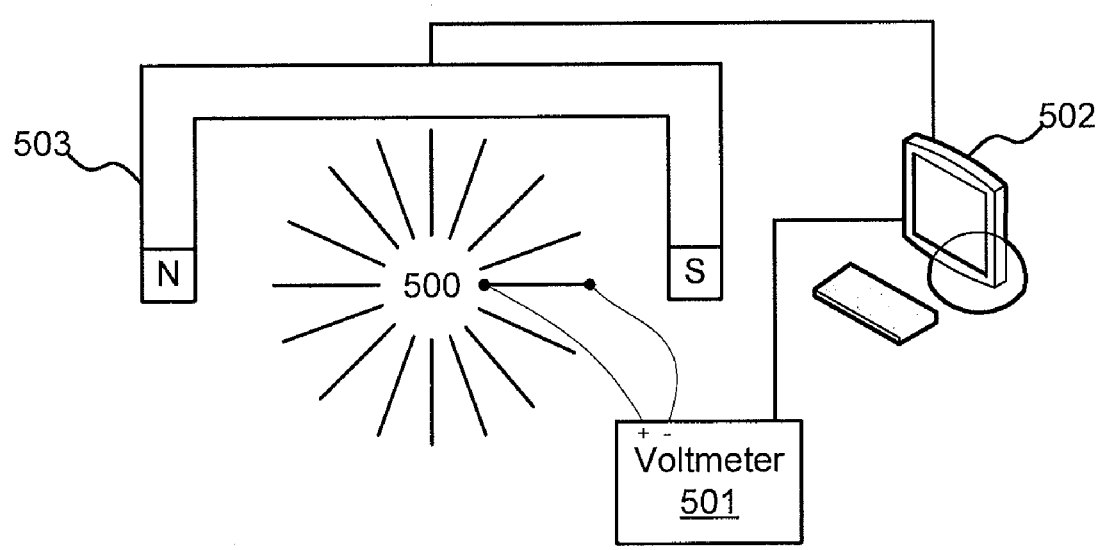
FIG. 5 is a diagram of an h-vector detector.

FIG. 5 shows a polar array 500 of Py microstrips fabricated on a substrate in accordance with one embodiment of the present invention. Particularly, polar array 500 may be used as an h-vector detector as described herein. Using this illustrative configuration, the h-vector may be determined without rotating the externally applied static magnetic field. The microstrips comprising polar array 500 are positioned at known different radial directions or angles with respect to each other. In certain embodiments, the polar array may span $\pi$ or $2\pi$ radians. The microstrips in the polar array 500 may be coupled to one or more voltmeters 501, and the one or more voltmeters may be coupled to computer 502. Computer 502 may be adapted to control external applied magnetic field H 503 applied to the array 500 of microstrips and/or to determine an h-vector component based on implementations of the methods described herein. In one embodiment, the computer 502 may cause the external applied magnetic field to sweep a predetermined intensity range ($\Delta H$) continuously.

In some embodiments, the h-vector detector may be used to detect single frequencies. In other embodiments, multiple frequencies may be detected, provided that the FMR resonance curves, such as in FIG. 2, are separated clearly, i.e. they occur at magnetic fields H which are sufficiently different in strength. Moreover, in additional embodiments, the direction of incoming plane waves may be extracted.

Some of the functions and algorithms described above may be implemented by computer 502 as software. The software may comprise instructions executable on a digital signal processor (DSP), application-specific integrated circuit (ASIC), microprocessor, or any other type of processor. The software implementing various embodiments of the present invention may be stored in a computer readable medium of a computer program product. The term "computer readable medium" includes any medium operable to store or transfer information. Examples of the computer program products include an electronic circuit, semiconductor memory device, random access memory (RAM), static RAM (SRAM), dynamic RAM (DRAM), synchronous DRAM (SDRAM), read only memory (ROM), erasable ROM (EROM), erasable programmable ROM (EPROM), electrically erasable programmable ROM (EEPROM), flash memory, floppy diskette, compact disk (CD), optical disk, hard disk, or the like. The software may be downloaded via computer networks such as the Internet or the like.

Figure 6:
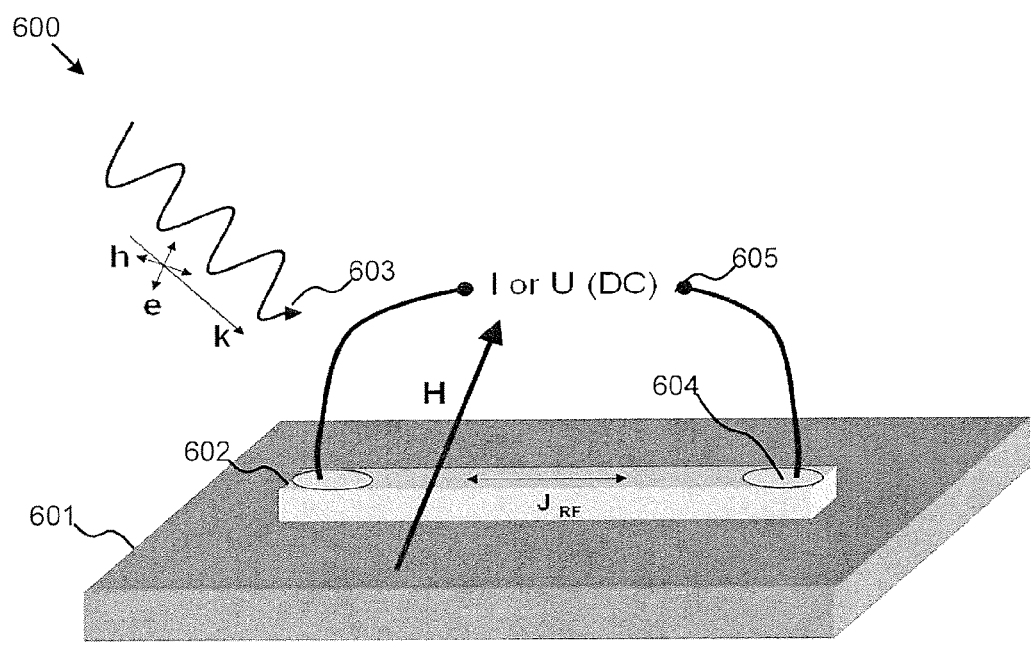
FIG. 6 is a schematic diagram of one embodiment of an h-vector detector.

FIG. 6 illustrates one embodiment of a detector 600 in accordance with the present embodiments detecting a microwave 603. In one embodiment, the detector 600 may include a substrate 601 and a ferromagnetic conductor or ferromagnetic semiconductor microstrip 602. For example, one embodiment may include a thin d=49 nm Permalloy (Ni 80%, Fe 20%) film stripe 602 (e.g., 200 µm wide and 2400 µm long) with 300×300 µm² bond pads 604 at both ends. In one embodiment, the bond pads 604 may be connected via gold bonding wires 605 and coaxial cables to a lock-in amplifier. For auxiliary measurements (e.g., Hall effect) six additional junctions may be attached along the stripe. In such an embodiment, the resistance of the film stripe 602 may be characterized as $R_0+R_A=85.0\Omega$ for parallel and $R_0=83.6\Omega$ for perpendicular magnetization. Hence the conductance may be characterized as $\sigma=1/\rho=2.9\times10^6\Omega^{-1}$ $m^{-1}$ and the relative AMR may be $\Delta\rho/\rho=1.7\%$. The absolute AMR may be $R_A=1.4\Omega$. In a further embodiment, the film may be deposited on a 0.5 mm thick GaAs single crystal substrate 601, and patterned using photolithography and lift off techniques. Additionally, the substrate 601 may be mounted on a 1 mm thick polyethylene printed circuit board (not shown). In such an embodiment, the circuit board may be glued to a brass plate holding it in between the poles of an electromagnet. This may provide the dc magnetic field $B=\mu_0 H$ (maximal=1 T (aprox.)). In a further embodiment, the sample may be fixed 1 mm behind the end of a WR62 (15.8 mm×7.9 mm) hollow brass waveguide which is mounted normal to the Permalloy film plane. The stripe may be fixed along the narrow waveguide dimension as illustrated in FIG. 1.

In the Ku band (12.4-18 GHz), the WR62 waveguide may only transmit the $TE_{10}$ mode. The stripe 602 may be fixed with respect to the waveguide but left rotatable with respect to H. Such an embodiment may allow the stripe 602 to be parallel or perpendicular to H, but keep H in the film plane. A high precision angle readout may be installed to indicate $\theta$. In a further embodiment, the waveguide may be connected to an HP83624B microwave generator (not shown) by a coaxial cable supplying frequencies of up to 20 GHz and a power of 200 mW. In a particular embodiment, microwave photovoltage measurements may be performed by sweeping the magnetic field H while fixing the microwave frequency.

To avoid external disturbances the photovoltage may be detected using a lock-in technique, wherein a low frequency (27.8 Hz) square wave signal is modulated on the microwave CW output. The lock-in amplifier, connected to the Permalloy stripe 602, may be triggered to the modulation frequency to measure the resulting square wave photovoltage across the sample. Instead of the photovoltage also the photocurrent can be measured.

In certain embodiments, a user may wish to avoid providing a quasi static field H provided by an electromagnet to avoid disturbing nearby electronic components. Indeed, it may be desirable to have a spin rectification effect (i.e. a DC signal) at zero applied field H (no electromagnet around the sample). In such an embodiment, spin rectification may arise if the magnetization vector M may start to precess and partially rectify the RF current j in the ferromagnet via the Anisotropic Magneto Resistance.

As with other oscillators, a restoring force and an exciting force may trigger pressession of the magnetization vector M. In one embodiment, an electromagnet may provide the field H which may act on the magnetization vector M to provide the restoring force. The microwave h component may act upon the magnetization vector M to provide the exciting force. If the restoring force due to h has the right strength, so that the Eigen frequency of the oscillator matches the frequency of h, then resonance sets in and the magnetization vector M may start to precess, leading to a spin rectification effect.

Although in certain embodiments, field H provides the restoring force, in certain other embodiments, anisotropy fields may also provide a restoring force. In such embodiments, anisotropy fields may be effected by the shape of the ferromagnet (shape anisotropy) or by the crystal structure of the ferromagnet (magneto-crystalline anisotropy). In a further embodiment, both may be present at the same time in the same sample. For example, when a GaMnAs detector is used, M may also precess without any H applied. In certain embodiments, such a detector may generate sufficient voltage and/or current to provide a microscopic voltage or current source. For example, if a ferromagnetic strip 602 is exposed to a selected microwave frequency at a selected angle, a DC signal may be generated due to the spin rectification effect.

In another embodiment, where the detector is configured to detect the full h-vector, different strengths of H (different strengths of the restoring force) may be characterized by the resonance curve U(H) which may then be separated into the Dispersive and Lorentz parts. In further embodiments, shape anisotropy field may be exploited to achieve different strengths of restoring forces by employing a set of stripes 602 with different length to width ratios, and therefore different anisotropy fields and different restoring forces.

Alternatively, magneto-crystalline anisotropy, which has different strengths depending on the material used, the lattice stress and possibly other parameters may exhibit different restoring forces in a zero field H. In such an embodiment, a set of stripes with different crystal anisotropies and therefore different strengths of restoring forces may be used to detect U(H) which can then be separated into Dispersive and Lorentz parts. In such an embodiment, each different restoring force may be equivalent to a different H applied.

The magneto-crystalline anisotropy may also be tuned electrically via the piezoelectric effect. In one embodiment one strip 602 may be used and its magneto-crystalline anisotropy would be changed by subjecting its lattice to different stresses, instead of applying different H fields to obtain U(H). This may be achieved by mechanically coupling it to a piezoelectric transducer. In a further embodiment, the crystal itself may be used, if it is a piezoelectric crystal like GaMnAs, in which case it may be subjected to an electric field and change its crystal anisotropy in response. In such embodiments, the use of magneto-crystalline and shape anisotropies may be calibrated to determine the equivalent H in order to obtain the resonance curve U(H).

As mentioned above, the spin rectification effect may be associated with precessing magnetization vector M and a RF current j inside the ferromagnet, which may be partially rectified to produce a DC signal. In such an embodiment, the precession of M may take place in the resonant case, (i.e., when the resonance frequency of the Ferromagnetic Resonance (FMR) of the ferromagnet is identical to the frequency of the incoming microwave radiation), such that the magnetic component of the radiation h resonantly excites M.

As described herein, the H detector and associated computer and software algorithms may utilize values for j, H and θ to deduce h. In a further embodiment, the principle may be inverted and j may be deduced, if values for H, θ, and h are known. In such an embodiment, j may be externally injected into the ferromagnet, and the geometry of the detector may be such, that no j is induced by the microwaves. Thus, if the precession of M is known (via H and θ and h) a value for j may be deduced from it via analyzing the DC signal, i.e. the partially rectified j. This may be used to determine the frequency and the phase of j with respect to the frequency and phase of the precessing M.

In one example embodiment, the structure may be based on the basic ferromagnetic strip 602 on the substrate 601 with some additional components. For example, a magnet may be placed around the strip 602 to control H and θ at the position of the strip 602. In a further embodiment, the strip 602 may be placed close to a suitable microwave source to control h at the location of the strip 602. The microwave source may include an antenna, a hollow, 3-dimensional waveguide, or a coplanar (2 dimensional) waveguide. In one embodiment, the RF current to be analyzed may then be coupled into the strip 602 and the resulting DC signal analyzed as a function of h, H and θ.

In an alternative embodiment, another inversion of the original detection principle may include deducing H for a known h, j and θ. An example apparatus for this may include the basic strip 602 on a substrate 601 with certain additional components. For example, to control j a microwave generator or another source of a controlled current at GHz frequencies may be coupled to the strip 602, so that the phase (relative to h) and frequency of j is known. In a further embodiment, the strip 602 may be placed near a suitable microwave source as in the case for deduction of j above. The spin rectification effect may set in if a suitable H is present. Therefore, by analyzing the DC signal as a function of h, j and angle θ, H may be deduced.

As mentioned above, the spin rectification effect may be present if M is precessing at resonance. The precession frequency may determine the frequency at which RF current j will be rectified. This frequency may be tuned by the field H.

The Kittel formula may give the dispersion ω(H) (i.e., the resonance frequency is a function of the strength of the applied field H). Therefore, at a given field H, M may be excited to precess by a suitable h. In such an embodiment, the precessing M may rectify RF current inside the ferromagnet which has the same frequency as the precession frequency of M (which may also be the same frequency as h).

Although certain embodiments of the present invention and their advantages have been described herein in detail, it should be understood that various changes, substitutions and alterations can be made without departing from the spirit and scope of the invention as defined by the appended claims. Moreover, the scope of the present invention is not intended to be limited to the particular embodiments of the processes, machines, manufactures, means, methods, and steps described herein. As a person of ordinary skill in the art will readily appreciate from this disclosure, other processes, machines, manufactures, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufactures, means, methods, or steps.

The invention claimed is:
1. A method comprising:
receiving an external RF magnetic field with a h-vector detector;
measuring voltages across terminals of the h-vector detector when the detector receives a microwave;
varying the angle between an external applied magnetic field and the RF current;
determining the angular dependence of the measured voltages; and calculating at least one magnetic-field vector (h-vector) component of the microwave based, at least in part, upon the angular dependence.

2. The method of claim 1, further comprising varying the intensity of the external magnetic field.

3. The method of claim 2, where determining the angular dependence of the measured voltages further comprises calculating, for each angle between the external applied static magnetic field and the RF current, Lorenz (L) and dispersive (D) amplitudes of the measured voltages (U) given by:

$$U = L\frac{\Delta H^2}{(H-H_0)^2 + \Delta H^2} + D\frac{\Delta H(H-H_0)}{(H-H_0)^2 + \Delta H^2},$$

where H is the applied magnetic field, $H_0$ is the resonant magnetic field, and $\Delta H$ is the half width at half maximum (HWHM).

4. The method of claim 3, where calculating the Lorenz (L) and dispersive (D) amplitudes comprises performing at least one curve fitting operation.

5. The method of claim 3, where calculating the at least one h-vector component further comprises numerically fitting at least one of equations:

$L = -R_A R_{S0} M_0 j_z \sin(2\theta)(-A_{xx} h_x^i \cos(\theta) + A_{xx} h_z^i \sin(\theta) - A_{xy} h_y^r)/2$ and $D = -R_A R_{S0} M_0 j_z \sin(2\theta)(A_{xx} h_x^r \cos(\theta) - A_{xx} h_z^r \sin(\theta) - A_{xy} h_y^i)/2,$ where $h_{x,y,z}^{r,i}$ are h-vector components indicating real (r) and imaginary (i) parts of the complex number $h_{x,y,z}$, $\theta$ is the angle between the external applied static magnetic field and the RF current, and amplitudes of effective permeability tensor components $A_{xx}$ and $A_{xy}$ are given by:

$$A_{xx} = \frac{\gamma(H_0 M_0 + M_0^2)}{\alpha_G \omega(2H_0 + M_0)}$$

and $$A_{xy} = \frac{M_0}{\alpha_G(2H_0 + M_0)}$$

for $|H - H_0| \ll H_0,$ where $\gamma$ is a gyromagnetic ratio, $M_0$ is the saturation magnetization, $\alpha_G$ is the Gilbert damping constant, and $\omega$ is the frequency of the microwave.

6. The method of claim 1, the magnetic field detector comprising a microstrip having dimensions such that $d \ll w \ll l \ll \lambda$, where w is the width of the microstrip, d is the thickness of the microstrip, l is the length of the microstrip, and $\lambda$ is the wavelength of the microwave.

7. The method of claim 1, further comprising calculating an RF current j in response to measured values of the static magnetic field H, angle $\theta$, and RF magnetic field h.

8. The method of claim 1, further comprising calculating a static field H in response to measured values of the RF current j, angle $\theta$, and RF magnetic field h.

9. A method comprising:
providing an array of RF magnetic field detectors, each element of the array being positioned at a different angle with respect to each other;
subjecting the array to an external applied swept magnetic field;
measuring voltages across terminals of each element of the array when the array receives a microwave;
associating each measured voltage with a respective angle; and
calculating at least one magnetic-field vector (h-vector) component of the microwave based, at least in part, upon the association.

* * * * *